United States Patent
Franklin et al.

(10) Patent No.: US 6,568,896 B2
(45) Date of Patent: May 27, 2003

(54) TRANSFER CHAMBER WITH SIDE WALL PORT

(75) Inventors: Timothy J. Franklin, Campbell, CA (US); Dan A. Marohl, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/814,807

(22) Filed: Mar. 21, 2001

(65) Prior Publication Data

US 2002/0134506 A1 Sep. 26, 2002

(51) Int. Cl.$^7$ ............................................. H01L 21/00
(52) U.S. Cl. ...................................... 414/217; 414/935
(58) Field of Search ......................... 414/217; 417/217, 417/935

(56) References Cited

U.S. PATENT DOCUMENTS

| | | | |
|---|---|---|---|
| 4,277,304 A | 7/1981 | Horiike et al. | 156/643 |
| 4,680,474 A | 7/1987 | Turner et al. | 250/492.2 |
| 4,857,132 A | 8/1989 | Fisher | 156/345 |
| 5,316,794 A | 5/1994 | Carlson et al. | 427/248.1 |
| 5,410,791 A * | 5/1995 | Wirth et al. | 29/235 |
| 5,411,593 A | 5/1995 | Carlson et al. | 118/719 |
| 5,516,732 A | 5/1996 | Flegal | 437/250 |
| 5,589,737 A * | 12/1996 | Barnes et al. | 315/111.21 |
| 5,670,066 A * | 9/1997 | Barnes et al. | 219/121.58 |
| 5,728,602 A | 3/1998 | Bellows et al. | 437/225 |
| 5,951,772 A | 9/1999 | Matsuse et al. | 118/723 R |
| 5,994,662 A * | 11/1999 | Murugesh | 219/121.43 |
| 6,071,350 A | 6/2000 | Jeon et al. | 118/719 |
| 6,082,950 A | 7/2000 | Altwood et al. | 414/217 |
| 6,130,415 A | 10/2000 | Knoot | 219/502 |
| 6,167,323 A | 12/2000 | Komino et al. | 700/121 |
| 6,235,656 B1 | 5/2001 | Clarke | 438/800 |
| 6,355,397 B1 * | 3/2002 | Chiu | 430/296 |
| 2001/0003271 A1 * | 6/2001 | Otsuki | 118/723 |

FOREIGN PATENT DOCUMENTS

| | | | |
|---|---|---|---|
| JP | 2000-286207 | 10/2000 | H01L/21/26 |
| WO | 00/70116 | 11/2000 | C23C/16/00 |
| WO | 01/04937 | 1/2001 | H01L/21/00 |

* cited by examiner

*Primary Examiner*—Steven A. Bratlie
(74) *Attorney, Agent, or Firm*—Moser, Patterson & Sheridan

(57) ABSTRACT

A chamber for transferring a substrate is provided. In one embodiment, a chamber for transferring a substrate includes at least one side wall supporting a lid and coupled to a chamber bottom. The side wall, lid and chamber bottom defining an evacuable volume therebetween. A passage is disposed at least partially through the side wall and chamber bottom. The passage has a first end that is disposed in the side wall and is exposed to the evacuable volume. The passage has a second end that is disposed on an exterior side of the chamber bottom. The passage may be utilized as a pumping port when coupled to a pumping system at the second end of the passage. Additionally, the port may be utilized as a sensor housing to shield the sensor from objects within the transfer chamber.

21 Claims, 4 Drawing Sheets

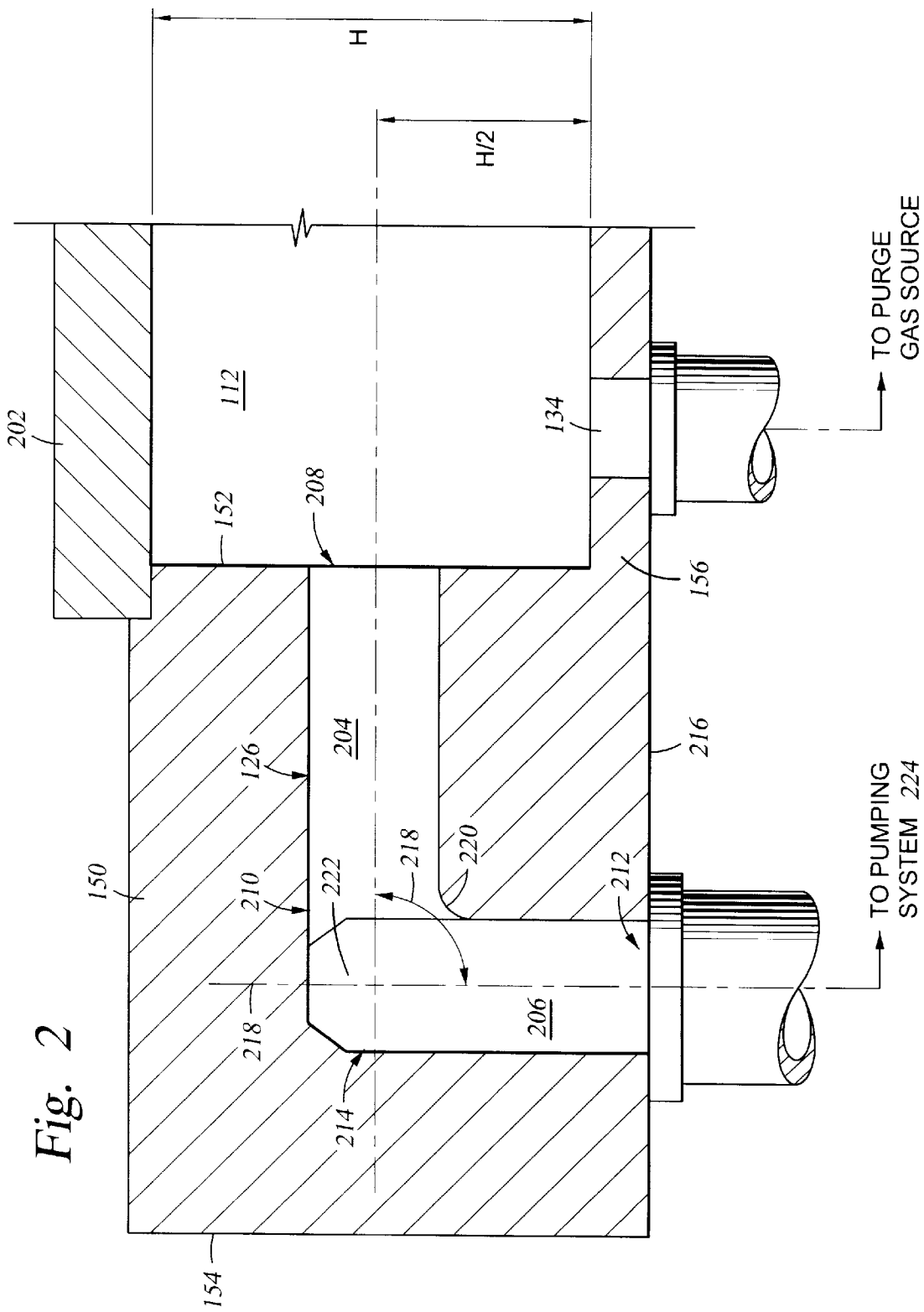

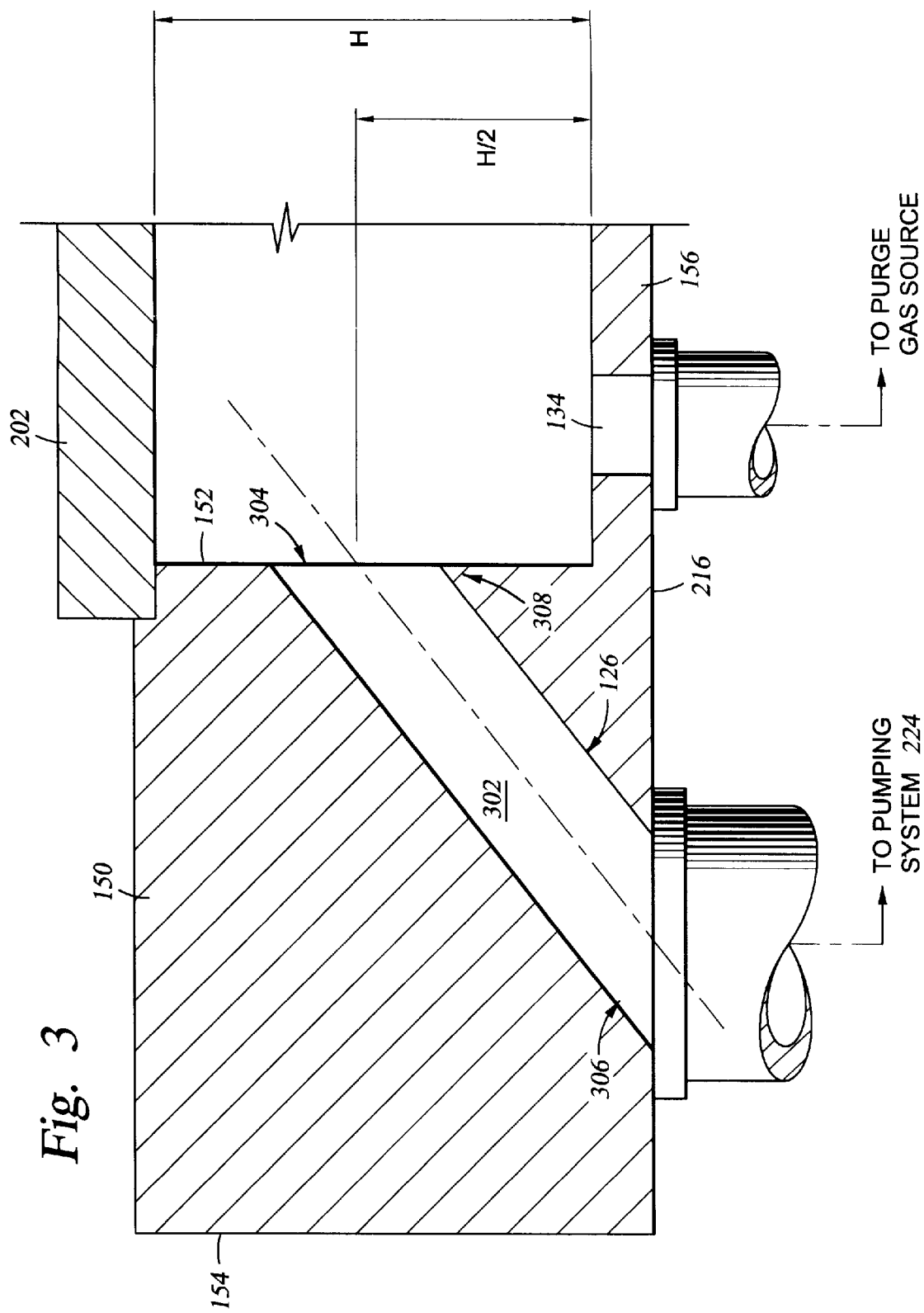

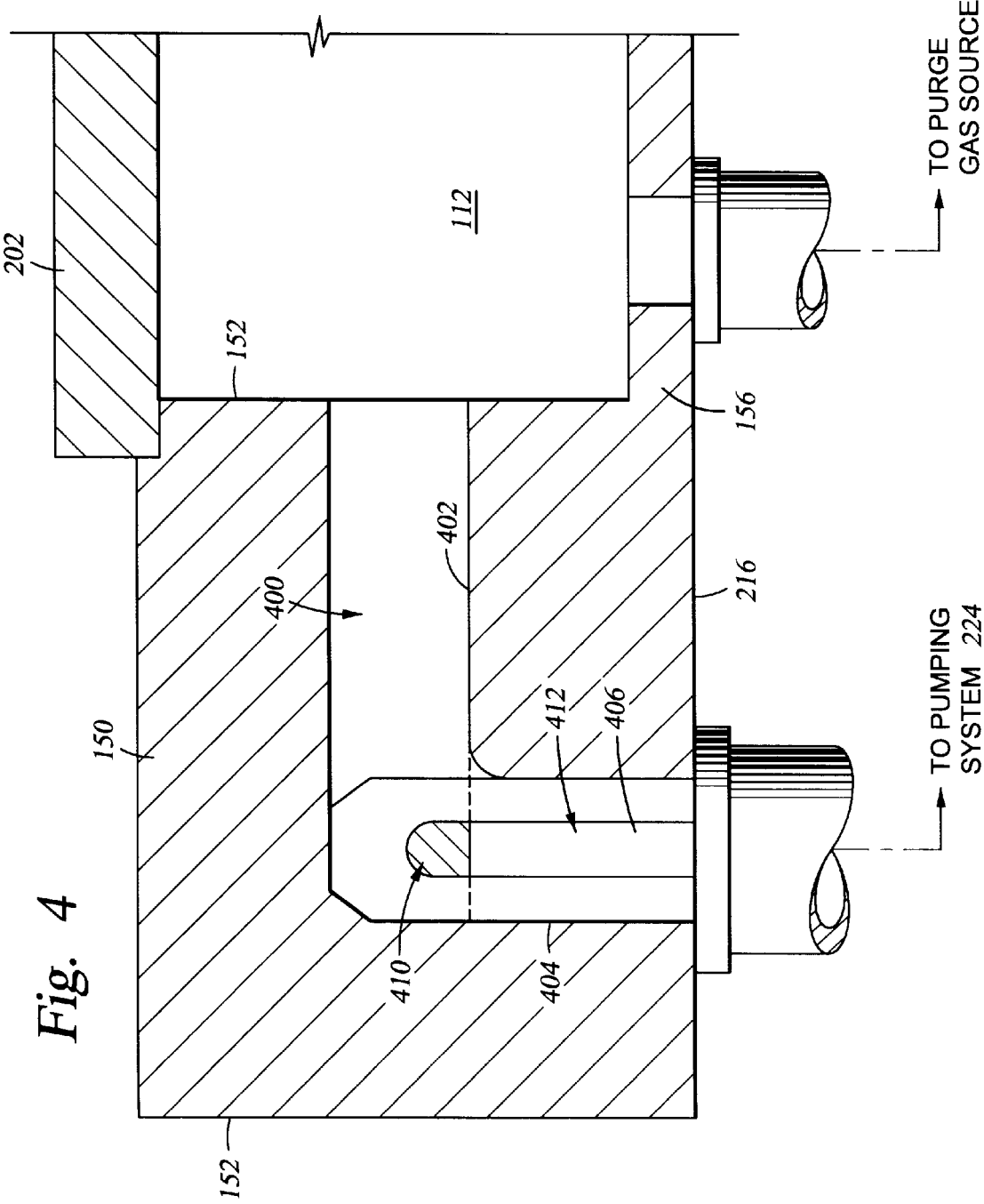

TRANSFER CHAMBER WITH SIDE WALL PORT

BACKGROUND OF THE DISCLOSURE

1. Field of Invention

The embodiments of the present invention generally relate to a transfer chamber utilized in semiconductor fabrication systems.

2. Background of Invention

Semiconductor substrate processing is typically performed by subjecting a substrate to a plurality of sequential processes to create devices, conductors and insulators on the substrate. These processes are generally performed in a process chamber configured to perform a single step of the production process. In order to efficiently complete the entire sequence of processing steps, a number of process chambers are typically coupled to a central transfer chamber that houses a robot to facilitate transfer of the substrate between the surrounding process chambers. A semiconductor processing platform having this configuration is generally known as a cluster tool, examples of which are the families of CENTURA® and ENDURA® processing platforms available from Applied Materials, Inc., of Santa Clara, Calif.

Generally, a cluster tool consists of a central transfer chamber having a robot disposed therein. The transfer chamber is generally surrounded by one of more process chambers and at least one load lock chamber to facilitate transfer of substrates into and out of the tool. The process chambers are generally utilized to process the substrate, for example, performing various processing steps such as etching, physical vapor deposition, chemical vapor deposition, ion implantation, lithography and the like. As the processes performed in the process chambers are generally performed at vacuum pressure, the transfer chamber is maintained at vacuum pressure as well to eliminate having to repeatedly pump down the process chamber after each substrate transfer.

Vacuum is established and maintained in the transfer chamber utilizing a pumping system coupled thereto. Typically, the pumping system is coupled to the transfer chamber via a pumping port that is disposed in the bottom of the transfer chamber. The pumping port is centrally located in the chamber bottom to enhance the conductance of the chamber. Good conductance allows for smaller pumping components and faster chamber pump down times.

However, having the pumping port disposed in the chamber bottom often allows intake into the pumping system of contaminants such as particles and substrate fragments that accumulate on the chamber bottom. These particles and other contaminants reduce the performance and service life of the pumping components.

One solution that has been employed to minimize particle intake is to utilize a tubular extension fastened over the port to elevate the port's intake above the chamber bottom. The tubular extension, while not significantly effecting pumping conductance adversely, creates an obstacle that must be avoided by the robots moving within the chamber. Moreover, vibration produced by the pumping components and other chamber devices cause particles to be generated at the extension/chamber interface. These particles also adversely affect the pump's performance and service life, thereby not totally resolving the increased maintenance interval required to maintain the pump's efficiency due to particle exposure.

Another problem encountered in transfer chambers is damage to sensors and probes disposed therein. For example, ion probes such as those employed to monitor the ion energy and ion density within the transfer chamber. Ion probes typically include an exposed filament that is easily damaged upon contact. During routine chamber maintenance to remove particulates and other contamination from the interior of the chamber, the probe's filament, which is disposed or positioned adjacent to the wiped areas, is susceptible to damage by the technicians. Accidental contact of the probe by the technicians during the wipe-down may damage the filament, rendering the probe inoperable, necessitating the opening of the transfer chamber to replace the probe and further cleaning of the chamber.

Moreover, sensors utilized in the transfer chamber are commonly positioned in or near ports disposed on the chamber bottom. Particulates that accumulate on the chamber bottom may enter the port having the sensor disposed therein. Additionally, gas ports positioned on the chamber bottom adjacent the sensor port may blow particles into the sensor port. The particles entering the sensor port may contaminate the sensor and adversely affect sensor accuracy.

Therefore, there is a need for an improved port in a transfer chamber for both sensor shielding and pumping applications.

SUMMARY OF INVENTION

One aspect of the invention generally provides a chamber for transferring a substrate. In one embodiment, a chamber for transferring a substrate is provided that includes at least one side wall coupled to a chamber bottom and supporting a lid that define an evacuable volume therebetween. A passage is disposed through the side wall and chamber bottom. The passage has a first end that is disposed in the side wall and is exposed to the evacuable volume. The passage has a second end that is disposed on an exterior side of the chamber bottom. The system may further comprise a pumping system that is coupled to the second end of the passage. The passage enhances pumping conductance while protecting pumping system components elevating the first end from the chamber bottom.

In another aspect of the invention, a chamber for transferring a substrate is provided that includes at least one side wall coupled to a chamber bottom defining an evacuable volume therebetween. A passage having a first portion and a second portion is disposed through the side wall and chamber bottom. The first portion of the passage is exposed to the evacuable volume. The second portion of the passage is coupled obliquely to the first portion and has a sensor disposed therein. As the probe's position in the second portion of the passage shields the probe from the interior volume of the chamber, the probe is protected from incidental contact and possible damage by activities within the transfer chamber.

BRIEF DESCRIPTION OF DRAWINGS

The teachings of the present invention can readily be understood by considering the following detailed description in conjunction with the accompanying drawings in which:

FIG. 2 depicts a partial sectional view of the transfer chamber showing a passage therethrough taken along section line 2—2 of FIG. 1;

FIG. 3 depicts another embodiment of a passage disposed through a transfer chamber; and FIG. 4 depicts a partial sectional view of the transfer chamber taken along section line 4—4 of FIG. 1.

To facilitate understanding, identical reference numerals have been used, wherever possible, to designate identical elements that are common to the figures.

DETAILED DESCRIPTION OF INVENTION

Figure 1:
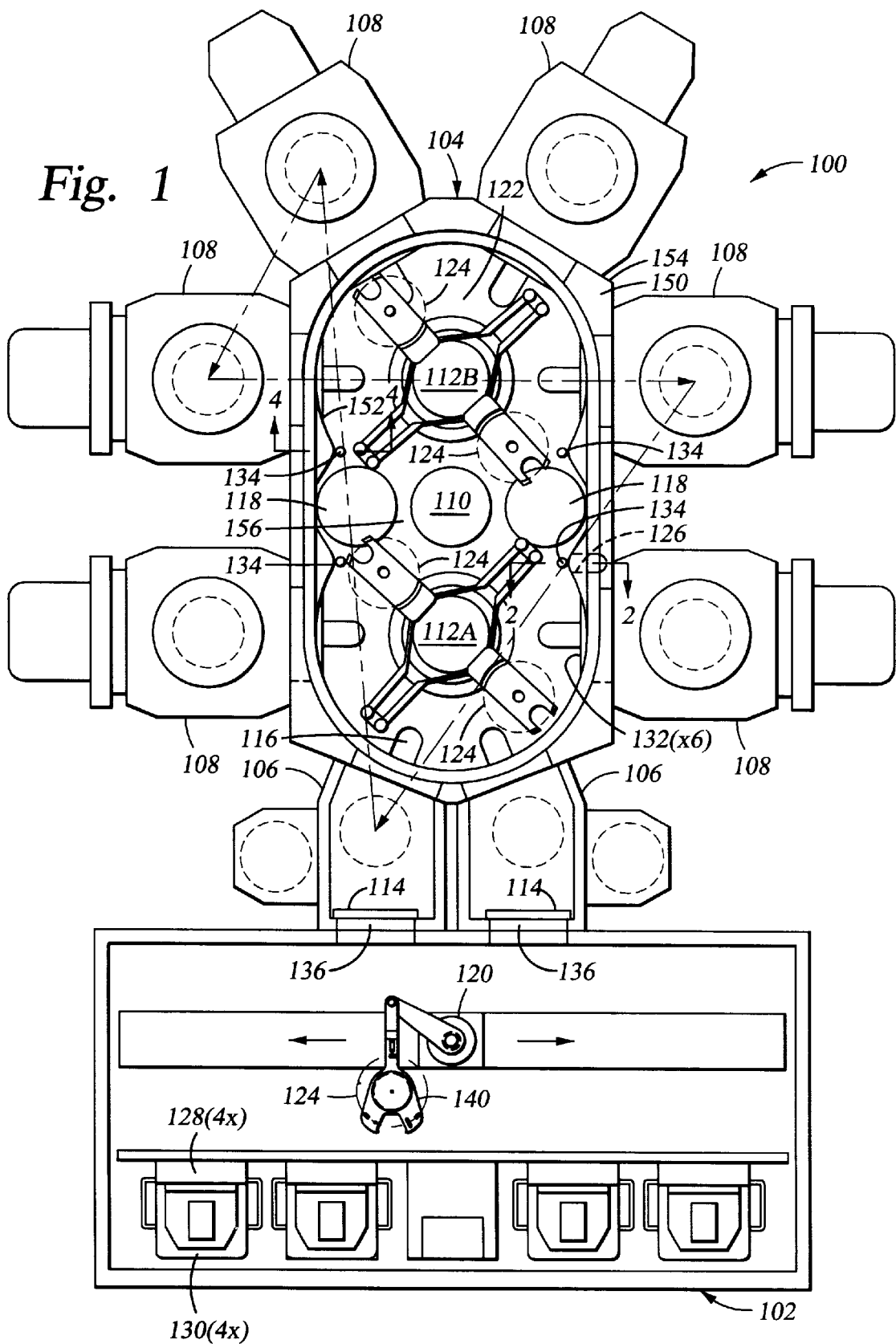
FIG. 1 depicts a plan view of a substrate processing system that includes one embodiment of a transfer chamber of the invention.

FIG. 1 depicts a processing system 100 that generally includes a factory interface 102, at least one load lock chamber 106, a plurality of process chambers 108 and one embodiment of a substrate transfer chamber 104 of the invention. The transfer chamber 104 generally includes at least one passage 126 disposed therein that may be utilized to provide one or more high conductance pumping ports. Optionally, the passage 126 may be utilized to shield a sensor disposed therein or as a gas supply port. Alternatively, the transfer chamber 104 may include two or more passages 126 wherein at least one passage 126 is utilized as a pumping port while at least one of the other passages may be utilized as a sensor port. One example of a transfer chamber that may be adapted to benefit from the invention is an ENDURA® SL processing platform, available from Applied Materials, Inc., of Santa Clara, Calif. Although the passage 126 is described disposed in the exemplary transfer chamber 104 shown in FIG. 1, the description is one of illustration and, accordingly, the passage 126 has utility wherever high conductance pumping ports are desired in vacuum application or applications where a sensor requires shielding. For example, both processing and load lock chambers may benefit by having a passage 126 as taught herein.

The factory interface 102 generally includes an interface robot 120 and a plurality of bays 128. Each bay 128 is adapted to receive a substrate storage cassette 130. Generally, the factory interface 102 is coupled to the load lock chamber 106 through a port 136 that is positioned opposite the bays 128. The interface robot 120 includes a blade 140 having an edge gripper or vacuum gripper used to secure the substrate 124 thereto during transfer. The interface robot 120 is generally positioned between the port 136 and bays 128 to facilitate transfer of substrates between the cassettes 130 and the load locks 106. An example of one factory interface that may be adapted to benefit from the invention is described in U.S. patent application Ser. No. 09/161,970, filed Sep. 28, 1998 by Kroeker, which is hereby incorporated by reference in its entirety.

The load lock chambers 106 (two are shown) are generally coupled between the factory interface 102 and the transfer chamber 104. The load lock chambers 106 are generally used to facilitate transfer of the substrates 124 between the vacuum environment of the transfer chamber 104 and the environment of the factory interface 102 which is typically at or near atmospheric pressure. Each load lock chamber 106 is selectively isolated from the factory interface 102 and transfer chamber 104 by slit valves 114, 116. Generally, at least one slit valve 114, 116 is maintained in a closed position to prevent loss of vacuum in the transfer chamber 104. For example, the slit valve 114 may be opened while the slit valve 116 is closed to allow the interface robot 120 to transfer substrates through the port 136 between the load lock chamber 106 and the substrate storage cassettes 130 disposed in the factory interface 102. After the substrate is loaded from the interface robot 120, both slit valves 114 and 116 are closed as the load lock chamber 106 is evacuated by a roughing pump (not shown) to a vacuum level substantially equal to that of the transfer chamber 104. The substrate in the evacuated load lock 106 is passed into the transfer chamber 104 by opening the slit valve 116 while the slit valve 114 remains closed. Processed substrates are returned to the factory interface 102 in the reverse manner, wherein load lock chamber 106 is vented to substantially equalize the pressure between the load lock chamber 102 and the factory interface 102. One slit valve that may be used to advantage is described in U.S. Pat. No. 5,226,632, issued Jul. 13, 1993 to Tepman et al., and is hereby incorporated by reference in its entirety.

The transfer chamber 104 is generally fabricated from a single piece of material such as aluminum. The transfer chamber 104 generally includes a side wall 150 and chamber bottom 156 that define an evacuable interior volume 122 therebetween. Substrates 124 are transferred between the process chambers 108 and load lock chambers 106 coupled to the exterior of the chamber 104 through a vacuum maintained within the volume 122.

At least one transfer robot is disposed in the transfer chamber 104 to facilitate transfer of substrates between the process chambers 108. In the illustrative embodiment depicted in FIG. 1, a first transfer robot 112A and a second transfer robot 112B are disposed in the interior 122 of the transfer chamber 104. The robots 112A, 112B may be of the dual or single blade variety. The robots 112A, 112B typically have a "frog-leg" linkage that is commonly used to transfer substrates in vacuum environments. The first robot 112A is generally disposed in an end of the transfer chamber 104 adjacent the load locks 106. The second robot 112B is disposed in an opposite end of the transfer chamber 104 such that each robot 112A, 112B services the adjacent process chambers 108.

One or more transfer platforms 118 are generally provided in the interior 122 of the chamber 104 to facilitate substrate transfer between robots 112A, 112B. For example, a substrate retrieved from one of the load locks 106 by the first robot 112A is set down on one of the platforms 118. After the first robot 112A is cleared from the platform 118 supporting the substrate 124, the second robot 112B retrieves the substrate from the platform 118. The second robot 112B may then transfer the substrate to one of the process chambers 108 serviced by the second robot 112B at that end of the transfer chamber 104.

The process chambers 108 are typically bolted to an exterior side 152 of the side walls 150 of the transfer chamber 104. Examples of process chambers 108 that may be utilized are etching chambers, physical vapor deposition chambers, chemical vapor deposition chambers, ion implantation chambers, lithography chambers and the like. Different process chambers 108 may be coupled to the transfer chamber 104 to provide a processing sequence necessary to form a predefined structure or feature upon the substrate's surface. An aperture (not shown) is disposed in the side wall between each process chamber 108 (or other chamber) to allow the substrate to be passed between the process chamber 108 and interior volume 122 of the transfer chamber 104. A slit valve 132 configure similar to the slit valves 114, 116, selectively seals each aperture to maintain isolation between the environments of the chambers 108, 104 between substrate transfers and during processing within the process chambers 108.

A plurality of ports 134 are generally disposed in the chamber bottom 156 proximate the side walls 150. The ports 134 may be utilized for various applications, for example, sampling the environment within the interior volume 122, housing sensors and flowing gases such as purge gases into the transfer chamber 104.

Vacuum is typically maintained in the transfer chamber 104 during chamber use since pumping the transfer chamber down to operable vacuum levels may take as long as eight hours. Generally, the interior volume 122 is covered by a chamber lid 202 and evacuated by at least one pumping system 224 (see FIG. 2).

In one embodiment, the volume 122 is evacuated in two stages. First, the volume 122 is pumped down to a first vacuum level using a roughing pump coupled to the passage 126. Once the first vacuum level is achieved, the vacuum level of the volume 122 is further reduced to an operating or second vacuum level by a high vacuum pump, for example, a turbomolecular or cryogenic pump (not shown). The high vacuum pump may be coupled in tandem with the roughing pump to the passage 126 or may be coupled to the chamber 104 through a dedicated port.

For example, a cryogenic or turbomolecular pump (not shown) may be coupled to the transfer chamber 104 through a pumping port 110 disposed on the chamber's bottom 156 to maintain a predefined vacuum within the chamber 104. Typically, a gate valve (not shown) is disposed between the cryogenic pump and the chamber 104 to facilitate service of the pump without loss of vacuum within the transfer chamber 104.

FIG. 2 depicts a partial sectional view of the transfer chamber 104 illustrating one embodiment of the passage 126. Generally, the passage 126 is comprised of a first section 204 and a second section 206. The first section 204 is disposed in the side wall 150 of the transfer chamber 104 and is open to the interior volume 122. The first section 204 has a first end 208 disposed in the interior side 152 of the side wall 150 and a second end 210 that extends into the side wall 150. Typically, the first section 204 is orientated substantially parallel to the chamber bottom 156.

The second section 206 of the passage 126 includes a first end 212 and a second end 214. The first end 212 is disposed on an exterior side 216 of the chamber bottom 156. The first end is typically coupled to the pumping system 224 that is utilized to evacuate the interior volume 122 of the transfer chamber 104. The pumping system 224 generally includes at least a roughing pump, turbomolecular pump, cryogenic pump or the like. Having the pumping system 224 (and conduits connecting thereto) disposed on the exterior side 216 of the chamber bottom 156 does not add to the foot-print of the transfer chamber 104 thereby not adversely affecting the cost of ownership of the system 100. Optionally, the pumping system 224 may be configured to have the roughing pump coupled to the passage 126 while a cryogenic pump (or turbomolecular pump) is coupled to the transfer chamber 104 at the pumping port 110.

The second section 206 extends from the exterior side 216 of the chamber bottom 156 into the side wall 150. The second end 214 of the second section 206 generally intersects the second end 210 of the first section 204 at an intersection 222 having an angle 218. In one embodiment, the angle 218 at the intersection of the first section 204 and the second section 206 is an obtuse angle. In another embodiment, the angle 218 is 90 degrees.

An interior corner 220 of the intersection 222 is broken to enlarge a sectional area at the intersection 222. Increasing the sectional area of the passage 126 at the intersection 222 improves the conductance therethrough. For example, the interior corner 220 may be chamfered, radiused, or otherwise worked to remove material from the corner 220 thereby increasing the sectional area at the intersection 222. In one embodiment, first section 204 and the second section 206 have an equal sectional area (i.e., same diameter) while the sectional area across the intersection 222 is 1.5 times the sectional area of the first section 204 (or the second section 206).

The position of the first end 208 of the first section 204 along the interior side 152 of the side wall 150 may be chosen to promote conductance while limiting contamination entry into the passage 126. As the first end 208 of the first section 204 is elevated above the chamber bottom 156, debris such as substrate fragments, particles and the like are less-likely to enter the passage 126. Positioning the first end 208 closer to the lid 202 provides greater protection from contamination, especially where the passage 126 is disposed proximate a port 134 that is utilized for supplying purge gases to the interior volume 122 of the transfer chamber 104. Having the first end 208 positioned higher on the side wall 150 places the passage 126 further from particulate and other contamination blown out of the port 134 and off the chamber bottom 156 by gases leaving the port 134. Positioning the first end 208 midway between the chamber bottom 156 and the lid 202 provides enhanced conduction through the passage 126 as the first end 208 is positioned at the center of the volume being evacuated. Positioning the first end 208 closer to the bottom 156 or lid 202 accordingly decreases conductance relative the maximum performance obtained at the midway position. Although positioning the first end 208 at the midway position on the interior side 152 of the side wall 150 maximizes conductance, a different height of the passage 126 (i.e., closer to or farther from the chamber bottom 156) may be selected for enhanced particulate protection or other factors.

FIG. 3 depicts a partial sectional view of another embodiment of the passage 126. Generally, the passage 126 includes a bore 302 having a first end 304 and a second end 306. The first end 304 is disposed on the interior side 152 of the side wall 150. The second end 306 is disposed on the exterior side 216 of the chamber bottom 156. In one embodiment, the first end 304 includes a radius 308, chamfer or the like, to promote smooth flow into the bore 302. The second end 306 is coupled to the pumping system 224.

FIG. 4 depicts a partial sectional view of the transfer chamber 104 illustrating another embodiment of a passage 400. Generally, the passage 400 is configure similar to the passage 126 described with reference to FIGS. 2 and 3. Typically, the passage 400 includes a first section 402 coupled obliquely to a second section 404. The first section 402 is open to the interior volume 122 of the transfer chamber 104. The second section 404 is open to the exterior 216 of the chamber bottom 156.

A sensor 406 or other metrology device is disposed at least partially in the second section 404 of the passage 400. The sensor 406 may be an ion sensor, an example of which is available from Helix Technology Corporation, of Santa Clara, Calif. Alternatively, other sensors 406 may be disposed in the passage 400 such as temperature sensors, RGA sensors, baratron sensors, convectron sensors or other sensors utilized to detect attributes of the environment disposed within the transfer chamber 104.

The sensor 406, being housed in the second section 404 of the passage 400, is protected from contact by objects disposed in the interior volume 122 of the transfer chamber 104. For example, a technician wiping down the interior side 152 of the side walls 150 is prevented from contacting the sensor 406 since the sensor 406 "hidden" in the side walls 150. The first portion 402 of the passage 400 may be configured at a length adequate to provide isolation from objects such as fingers and wipes that may partially enter the passage 400 during cleaning. In such a configuration, the sensor 402 may include a portion 410 that is at least partially "viewable" through the first portion 402 from the interior volume 122 and a portion 412 that is out of the "line-of-sight" through the first portion 402 as depicted in FIG. 4. Alternatively, the sensor 406 may be disposed in the second portion 404 of the passage 400 such that the entire sensor 406 is be out of the line-of-sight (i.e., no portion of the sensor 406 is in the area depicted as region 410).

More than one passage 400 may be disposed in the transfer chamber 104. The passage 400 may also be used alone in the transfer chamber 104 or in concert with the passage 126. Alternatively, the passage 400 may be coupled to the pumping system 224 to provide both transfer chamber 104 evacuation and shielding for a sensor disposed therein.

Although the teachings of the present invention that have been shown and described in detail herein, those skilled in the art can readily devise other varied embodiments that still incorporate the teachings and do not depart from the scope and spirit of the invention.

What is claimed is:

1. A transfer chamber for use with substrate processing systems comprising:
   at least one side wall having an interior side;
   a plurality of substrate access ports disposed through the sidewalls;
   a lid supported by the side walls;
   a chamber bottom coupled to the side walls and having an interior side and an exterior side; the interior sides of the side wall, lid and chamber bottom defining an evacuable volume therebetween;
   a substrate transfer robot disposed in the evacuable volume and adapted to transfer a substrate through the access ports; and
   at least one passage disposed through the side wall and the chamber bottom, the passage having a first end disposed on the interior side of the side wall at a position above the chamber bottom.

2. The chamber of claim 1, wherein the first end is disposed in the wall at about midway between the lid nd the chamber bottom.

3. The chamber of claim 1 further comprising a sensor mounted in the passage.

4. The chamber of claim 3, wherein the sensor is selected from the group of measuring devices consisting of an ion sensor, a temperature sensor, a RGA sensor, baratron sensor and a convectron sensor.

5. The chamber of claim 1, wherein the passage further comprises:
   a first portion disposed in the side wall; and
   a second portion coupled to the first portion forming an obtuse or right angle intersection, the second portion terminating at a second end of the passage.

6. The chamber of claim 5, wherein the first portion and the second portion intersect at a right angle.

7. The chamber of claim 5, wherein the intersection of the first portion and the second portion has a sectional area 1.5 times a sectional area of the first or the second portion.

8. The chamber of claim 1 further comprising a pumping system coupled to a second end of the passage.

9. A transfer chamber for use with substrate processing systems comprising:
   at least one side wall having an interior side;
   a lid supported by the side walls;
   a chamber bottom coupled to the side walls and having an interior side and an exterior side; the interior sides of the side wall, lid and chamber bottom defining an evacuable volume therebetween;
   a substrate transfer robot disposed in the evacuable volume and adapted to transfer a substrate into and out of the evacuable volume; and
   at least one passage disposed through the side wall and the chamber bottom, the passage having a first end disposed on the interior side of the side wall and a second end disposed on the exterior side of the chamber bottom.

10. The chamber of claim 9, wherein the first end is disposed in the wall at about midway between the lid and the chamber bottom.

11. The chamber of claim 9 further comprising a sensor mounted in the second portion of the passage.

12. The chamber of claim 11, wherein the sensor is selected from the group of measuring devices consisting of an ion sensor, a temperature sensor, a RGA sensor, baratron sensor and a convectron sensor.

13. The chamber of claim 9, further comprising at least a roughing pump, a cryogenic pump or a turbomolecular pump coupled to the second portion.

14. The chamber of claim 9, further comprising:
   a second passage having a first end disposed on the interior side of the side wall and a second end disposed on the exterior side of the chamber bottom; and
   at least a roughing pump, a cryogenic pump or a turbomolecular pump coupled to the second end of the second passage.

15. The chamber of claim 9 wherein the passage further comprises:
   a first portion disposed in the side wall; and
   a second portion coupled to the first portion forming an obtuse or right angle intersection, the second portion terminating at the second end.

16. The chamber of claim 15, wherein the first portion and the second portion intersect at a right angle.

17. The chamber of claim 15, wherein the intersection of the first portion and the second portion has a sectional area 1.5 times a sectional area of the first or the second portion.

18. The chamber of claim 9 further comprising a pumping system coupled to the second end.

19. A chamber for transferring a substrate comprising:
   at least one side wall having an interior side and an exterior side, the exterior side having at least one process chamber coupled thereto;
   a chamber bottom coupled to the side walls and having an interior side and an exterior side; the interior sides of the side wall and chamber bottom defining an evacuable volume therebetween;
   at least one substrate transfer robot disposed in the evacuable volume;
   a passage having a first portion disposed in the side wall and a second portion coupled obliquely to the first portion, the first portion having an end disposed on the interior side of the side wall, the second portion having an end disposed on the exterior side of the chamber bottom; and
   a sensor at least partially disposed in the second portion of the passage.

20. The chamber of claim 19, wherein the sensor is not in a line-of-sight defined by the first portion of the passage.

21. The chamber of claim 20, wherein the second portion of the passage is coupled to a pumping system comprising at least a roughing pump, a cryogenic pump or a turbomolecular pump.

* * * * *